United States Patent
Ueunten

(10) Patent No.: US 7,882,482 B2
(45) Date of Patent: *Feb. 1, 2011

(54) LAYOUT SCHEMES AND APPARATUS FOR HIGH PERFORMANCE DC-DC OUTPUT STAGE

(75) Inventor: Paul Ueunten, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 134 days.

This patent is subject to a terminal disclaimer.

(21) Appl. No.: 11/871,915

(22) Filed: Oct. 12, 2007

(65) Prior Publication Data

US 2009/0096435 A1  Apr. 16, 2009

(51) Int. Cl.
*G06F 17/50* (2006.01)

(52) U.S. Cl. ............ 716/100; 716/118; 716/119; 716/120; 716/126; 716/132; 716/133; 438/6; 438/15; 438/25; 438/58; 438/62; 438/63; 438/66; 438/106; 438/108; 438/110; 438/112; 438/176; 257/202; 257/204; 257/207; 257/341; 257/343; 257/401

(58) Field of Classification Search ........ 716/1, 716/8–12, 15; 438/6, 15, 25, 58, 62–63, 438/66, 106–108, 110–112, 176, 128–130, 438/133, 136–138; 257/202–204, 207, 341–343, 257/401, 778–781

See application file for complete search history.

(56) References Cited

U.S. PATENT DOCUMENTS

| 5,677,567 | A | 10/1997 | Ma et al. | |
|---|---|---|---|---|
| 6,534,825 | B2 * | 3/2003 | Calafut | 257/335 |
| 6,563,366 | B1 * | 5/2003 | Kohama | 327/382 |
| 6,710,441 | B2 * | 3/2004 | Eden et al. | 257/698 |
| 6,828,658 | B2 | 12/2004 | Schmitz et al. | |
| 6,858,895 | B2 * | 2/2005 | Feldtkeller et al. | 257/330 |
| 6,940,189 | B2 * | 9/2005 | Gizara | 307/151 |
| 6,992,352 | B2 * | 1/2006 | Lai et al. | 257/335 |
| 7,808,222 | B2 * | 10/2010 | Ueunten | 323/271 |
| 2003/0067058 | A1 | 4/2003 | Abe et al. | |
| 2008/0035959 | A1 * | 2/2008 | Jiang | 257/204 |
| 2008/0048218 | A1 * | 2/2008 | Jiang | 257/288 |

* cited by examiner

*Primary Examiner*—Nghia M Doan
(74) *Attorney, Agent, or Firm*—Perkins Coie LLP

(57) ABSTRACT

A layout method that enables a high power switch mode voltage regulator integrated circuit to generate a large output current and achieve substantially low switching loss is disclosed. The layout method includes forming an array of switching elements on a semiconductor die, each switching element including a plurality of discrete transistors configured to have a substantially reduced ON resistance; and forming a plurality of gate driver circuits on the same die among the switching elements, all using a single metal process. Each gate driver circuit placed substantially close to and dedicated to drive only one switching element so that the gate coupling capacitance resistance product is substantially reduced.

18 Claims, 6 Drawing Sheets

LAYOUT SCHEMES AND APPARATUS FOR HIGH PERFORMANCE DC-DC OUTPUT STAGE

TECHNICAL FIELD

The present invention relates generally to the field of analog integrated circuits. More specifically, the present invention relates to switch-mode voltage regulators.

BACKGROUND

In today electronic devices such as microprocessors, memory, and graphic processors, there is an increase in demand for higher current while reducing integrated circuit manufacturing steps. At the same time, miniaturization and high power efficiency are also important contributing factors for the successes of these integrated circuits. The conventional method of layout and manufacturing processes for switch mode voltage regulator circuits has reached their limitations and cannot meet these demands. This is because the majority of integrated circuit (IC) process uses two or more metal layers due to signal routing complexity and the delivery of high current and power.

Referring now to FIG. 1A, a schematic diagram of a switch-mode voltage regulator circuit 100A is shown that includes a controller 120, a high-side Metal Oxide Semiconductor Field Effect Transistor (MOSFET) switch 140, and a low-side Metal Oxide Semiconductor Field Effect Transistor (MOSFET) switch 160. Now referring to a layout scheme of FIG. 1B, a conventional layout 100B that implements switch-mode voltage regulator integrated circuit 100A is shown that includes three separate semiconductor dies connected together by bond wires. The layout of switch-mode voltage regulator integrated circuit 100A includes a controller die 120, a high side MOSFET die 140, and a low side MOSFET die 160. For handling high current and high power demands, conventional layout 100B as described above requires a manufacturing process for three different dies, each necessitating multiple metal layers. This translates directly to high manufacturing costs and performance degradation at high frequencies and high current output. In addition, at high switching frequency above 500 kHz, bond wires become parasitic and degrade the performance of switch-mode voltage regulator 100A because of the high interconnection resistance. Furthermore, the layout scheme as shown in FIG. 1B cannot meet the miniaturization requirement. Obviously because three die attachments consume large silicon area.

Accordingly, there are needs for a layout method and circuit architecture that permit fewer manufacturing steps while achieving high current and high power efficiency. At the same time, there is a need for switch mode voltage regulator integrated circuit to occupy the least amount of silicon area. The layout scheme of the present invention meets the above needs.

SUMMARY

An objective of the present invention is to provide a layout method that enables a high power switch-mode voltage regulator integrated circuit to generate a large output current and to achieve high power efficiency while affording fewer manufacturing steps. The layout method includes forming an array of switching elements on a semiconductor die, each switching element including a plurality of discrete transistors configured to have a substantially reduced ON ($R_{DS(ON),min}$) resistance; and forming a plurality of gate driver circuits on the same die among the switching elements, all using a single metal process. Each gate driver circuit placed substantially close to and dedicated to drive only one switching element so that the gate coupling capacitance resistance product is substantially reduced.

Another objective of the present invention is to provide a high power switch-mode voltage regulator output stage that includes a semiconductor flip chip die that includes an array of switching elements configured to have a minimal ON resistance, and a plurality of gate driver circuits each placed substantially close to and dedicated to drive only one switching element so that the gate coupling resistance capacitance is optimal; and a lead frame structure that includes at least two electrical leads, each of the electrical lead having a plurality of finger shaped structures extended unilaterally outward. The two electrical leads are arranged so that the plurality of finger shaped structures forms an inter-digital pattern where the semiconductor flip chip die is attached to the lead frame structure.

Yet another objective of the present invention is to provide a chip scale package (CSP) for a switch-mode voltage regulator output stage that includes a semiconductor flip chip die that includes an array of switching elements configured to have a minimal ON resistance, and a plurality of gate driver circuits each placed substantially close to and dedicated to drive only one of said switching elements so that the gate coupling resistance capacitance is optimal; and a plurality of multi-layer power bus lines disposed parallel to one another and running substantially across the entire length of the semiconductor flip chip die. The plurality of multi-layer power bus lines, each comprising a thick metal layer, is electrically coupled to communicate with the array of switching elements. Each multi-layer power bus line is configured in such a geometrical shape that interconnection bumps are posited thereupon.

These and other advantages of the present invention will no doubt become obvious to those of ordinary skill in the art after having read the following detailed description of the preferred embodiments, which are illustrated in the various drawing Figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 2:
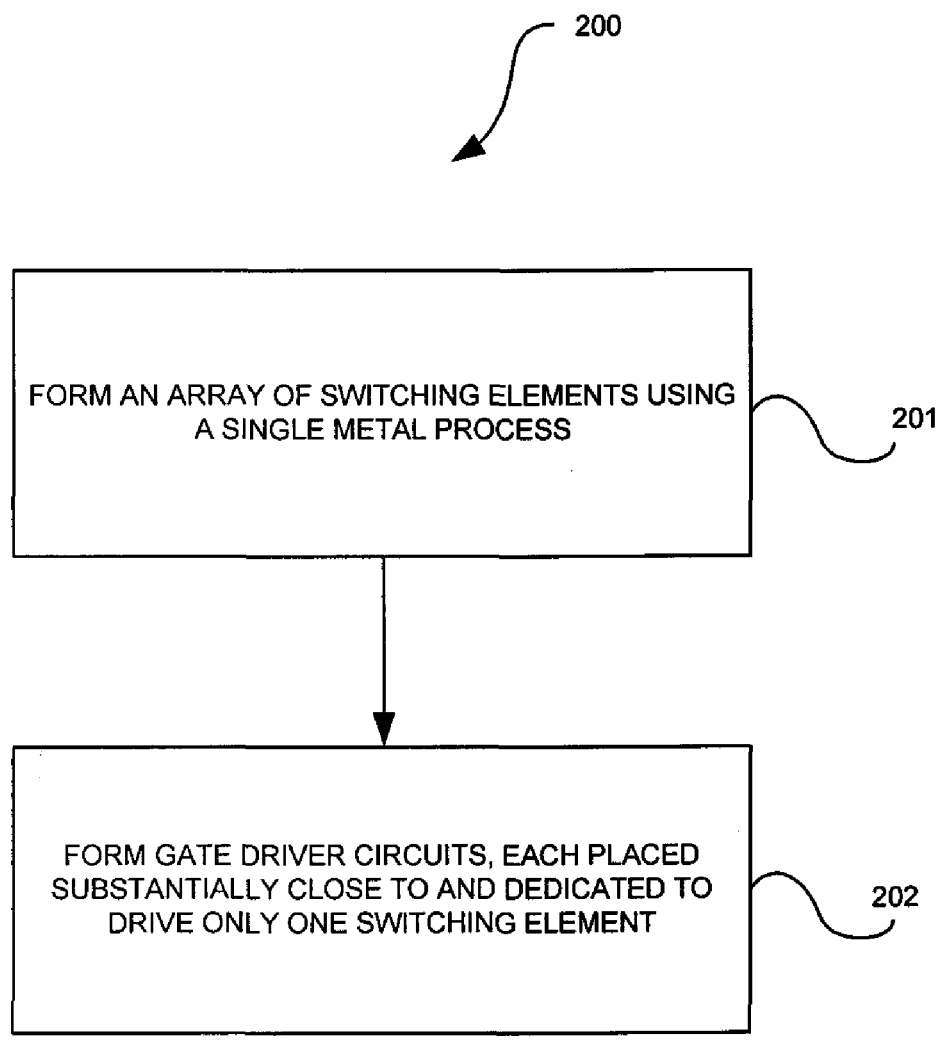
FIG. 2 illustrates a flow chart of a layout method in accordance with an embodiment of the present invention that enables switch-mode voltage regulator output stage to handle large current, achieve substantially low switching loss, and overcome limitations inherent in the conventional layout described in FIG. 1B.

Now referring to FIG. 2, a flow chart 200 of a layout method that enables a high power switch-mode voltage regulator output stage to generate high current and achieve high efficiency, low cost, and miniaturization in accordance with an embodiment of the present invention is illustrated. More particularly, the layout method 200 includes forming an array of switching elements on a semiconductor die using a single metal process, each switching elements including a plurality of discrete transistors configured to have a substantially reduced ON resistance ($R_{DS(ON),min}$); and forming gate driver circuits on the same semiconductor die among the switching elements, each gate driver circuit placed substantially close to and dedicated to drive only one switching element so that the gate coupling resistance capacitance is substantially reduced. Accordingly, the maximal amount of current from each gate driver circuit is injected into the gate of each switching element.

Figure 1A:
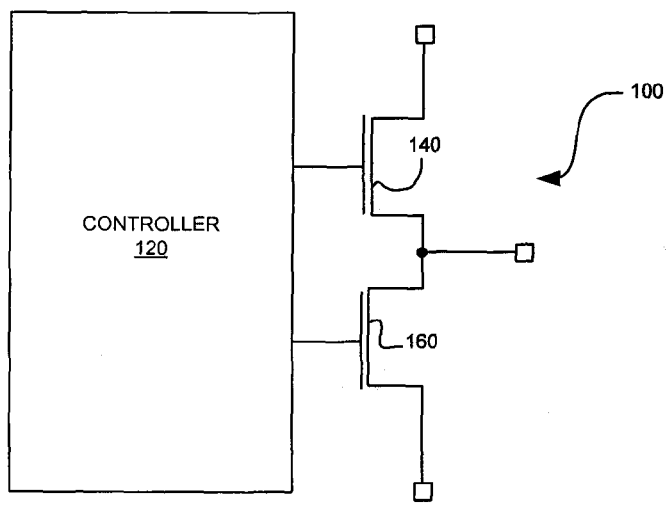
FIG. 1A illustrates a schematic diagram that represents a conventional layout method for a prior art switch-mode voltage regulator circuit.
Figure 1B:
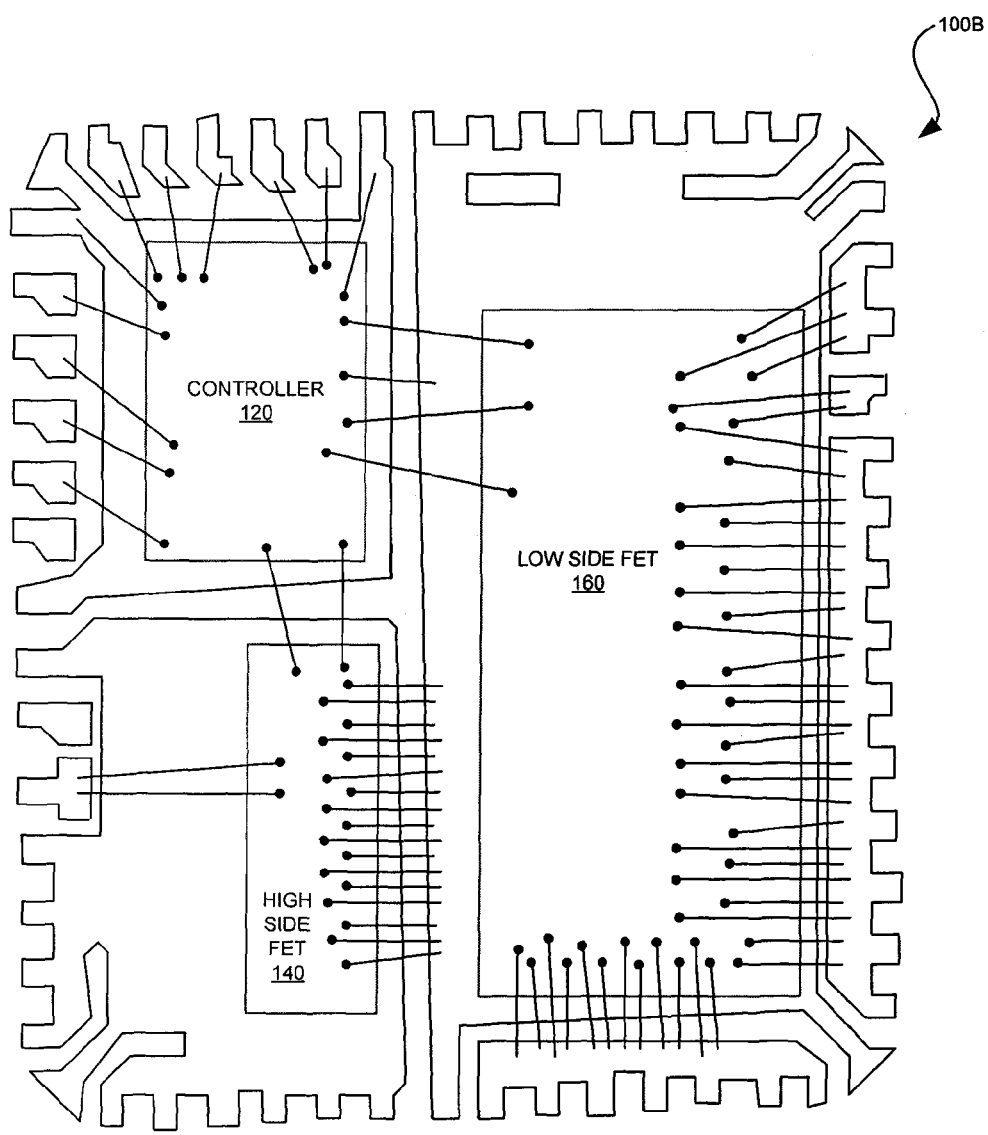
FIG. 1B illustrates a conventional layout for switch-mode voltage regulator circuit of FIG. 1A that includes three different semiconductor dies on the same package.

Referring to step 201, an array of switching elements is formed over a semiconductor die using single metal manufacturing process. Instead of using one DMOS switch for a high-side and another DMOS for a low-side as shown above in FIG. 1, step 201 of the present invention partitions a high-side switch and a low-side switch into an array of switching elements that are fabricated by a single metal process. To be more specific, step 201 starts by building a large number of discrete transistors successively and in parallel to one another using a single metal process. These discrete transistors form a switching element in the array. Next, repeating each switching element into plurality of switching elements to form an array. In one embodiment of the present invention, a switching element is a Double Diffused Metal Oxide Semiconductor (DMOS) that includes a drain electrode, a gate electrode, and a source electrode. A large number of discrete DMOS transistors are built by repeating the drain, gate, and source pattern. In one embodiment, step 201 also includes the step of laying out input contact pad and switch contact pad for receiving flip chip bumps that are electrically connected to each DMOS switching element. The flip chip bumps serve as input/output (I/O) electrical nodes that sum up current from the discrete DMOS transistors.

Now referring to step 202, a plurality of gate driver circuits are formed on the same semiconductor die. Each gate driver circuit is placed substantially close to and dedicated to drive only one switching element. In other words, each pair of gate driver circuit and its corresponding element can be matched to substantially reduce gate coupling resistance capacitance product. Accordingly, gate driver circuit is capable of delivering a maximum amount of current to its corresponding switching element. Unlike the prior art layout approach that separates the gate driver circuit from the switches, step 202 integrates gate driver circuits onto the same semiconductor die with the array of DMOS switching elements. This enables the usage of a single metal process to fabricate any a high power switch mode regulator circuit that is implemented by method 200. Furthermore, step 202 obviates the needs for bond wire connections, thus substantially reducing interconnection resistance between gate driver circuits and DMOS switching device.

Figure 3:
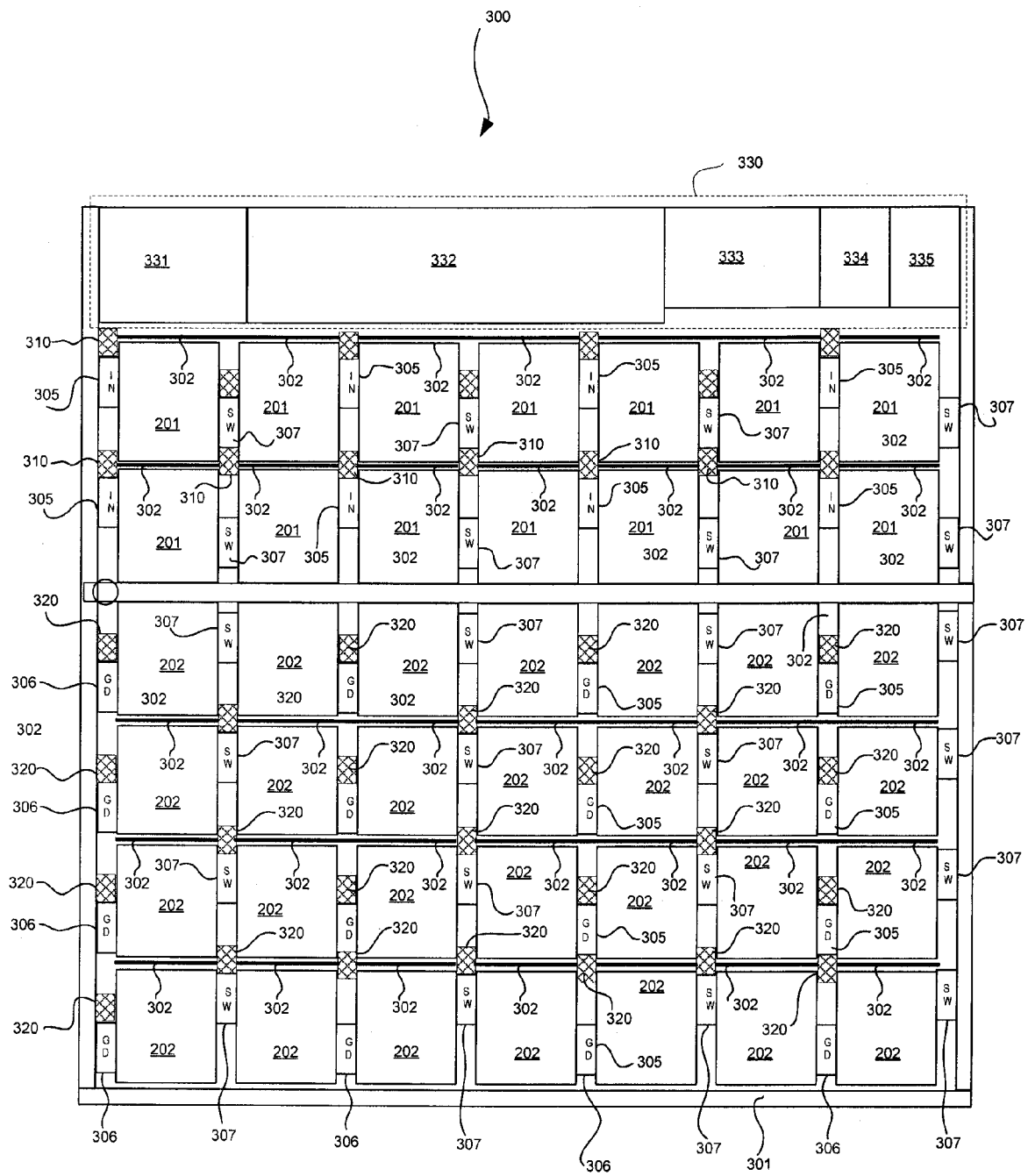
FIG. 3 illustrates a layout scheme for a high power switch mode voltage regulator output stage using the method illustrated in FIG. 2 that partitions the switches into arrays of high-side and low-side switching elements and integrates gate driver circuits on the same semiconductor die all fabricated by a single metal process in accordance with an embodiment of the present invention.

Now referring to FIG. 3, a planar view of a layout scheme using method 200 for a high power switch mode voltage regulator output stage 300 is illustrated. High power switch mode voltage regulator integrated circuit 300 includes a high-side array of switching elements 201 and a low-side array of switching elements 202, both arranged in rows and columns. In one embodiment of the present invention, both high-side switching element 201 and low-side switching element 202 are fabricated substantially the same and comprise a plurality of discrete Double Diffused Metal Oxide Semiconductor (DMOS) transistors. In one embodiment, a large number of discrete DMOS transistors is successively built that are parallel to one another to form high-side switching elements 201 and low-side switching element 202. As such, the density of integration of discrete DMOS transistors increases. In other words, being the DMOS power devices formed by a large number of discrete DMOS transistors connected in parallel, it is necessary to reduce as far as possible the dimension of single discrete DMOS transistors and to increase their number. In practice, the limitation to the reduction of the value of the ON resistance ($R_{DS(ON)}$) of DMOS high-side switching elements 201 and DMOS low-side switching elements 202, is determined by technological limits of area definition. Thus, each high-side switching element 201 and low-side switching element 202 achieves a minimally low ON resistance ($R_{DS(ON),min}$). Because of such configuration, both high-side array of switching elements 201 and low-side array of switching elements 202 can be fabricated by a single metal process. This is an implementation of step 201.

Continuing with FIG. 3, gate driver circuits 310 are fabricated on the same semiconductor die 301 and nestled among high-side array of switching elements 201. Similarly, gate driver circuits 320 are fabricated on the same semiconductor die 301 and nestled among low-side array of switching elements 202. On high-side array of switching elements 201, each gate driver circuit 310 is placed substantially close to and dedicated to drive only one high-side switching element 201. On low-side array of switching elements 202, each gate driver circuit 320 is placed substantially close to drive only one low side switching element 202. In one embodiment, high-side gate driver circuits 310 are fabricated exactly the same as low-side gate driver circuit 320. The fabrication of gate driver circuits 310 and gate driver circuits 320 is the implementation of step 202 of method 200. As a result of step 201 and step 202, high power switch-mode voltage regulator output stage 300 includes array of high-side switching elements 201, each having a dedicated gate driver circuit 310 placed substantially close to and dedicated to drive only one high side switching element 201. High power switch-mode voltage regulator output stage 300 fabricated in accordance with method 200 also includes array of low side switching elements 202, each having a dedicated gate driver circuit 320 placed substantially close to and dedicated to drive only one low side switching element 202. As a result, high side gate driver circuit 310 and low side gate driver circuit 320 achieve substantially reduced gate coupling resistance capacitance product, an important factor to allowing a maximal amount of current to be injected into each switching element 201 or 202.

In one embodiment of the present invention, after high side array of switching elements 201 and low side array of switching elements 202 are formed on the semiconductor die 301 in accordance with step 201 and step 202 respectively, an array of gate driver buses 302 are placed parallel to each other. Next, contact pads 302 are placed along the side of each gate driver bus 302 so that each high-side switching element 201 has an input contact pad (IN) 305 on one side and a switch contact pad (SW) 307 on the opposite side. In addition, each low-side switching element 202 has a ground contact pad (GND) 306 on one side and a switch contact pad (SW) 307 on the opposite side.

Continuing with FIG. 3, in one embodiment, semiconductor die 301 also partitioned to include a peripheral circuitry section 330 that includes a supply voltage regulator circuit 331, band gap circuit 332, a floating boot strap charging circuit 333, a first level shifter circuit 334, and a second level shifter circuit 335, all operable to provide internal control for high power switch-mode regulator circuit 300.

Figure 4:
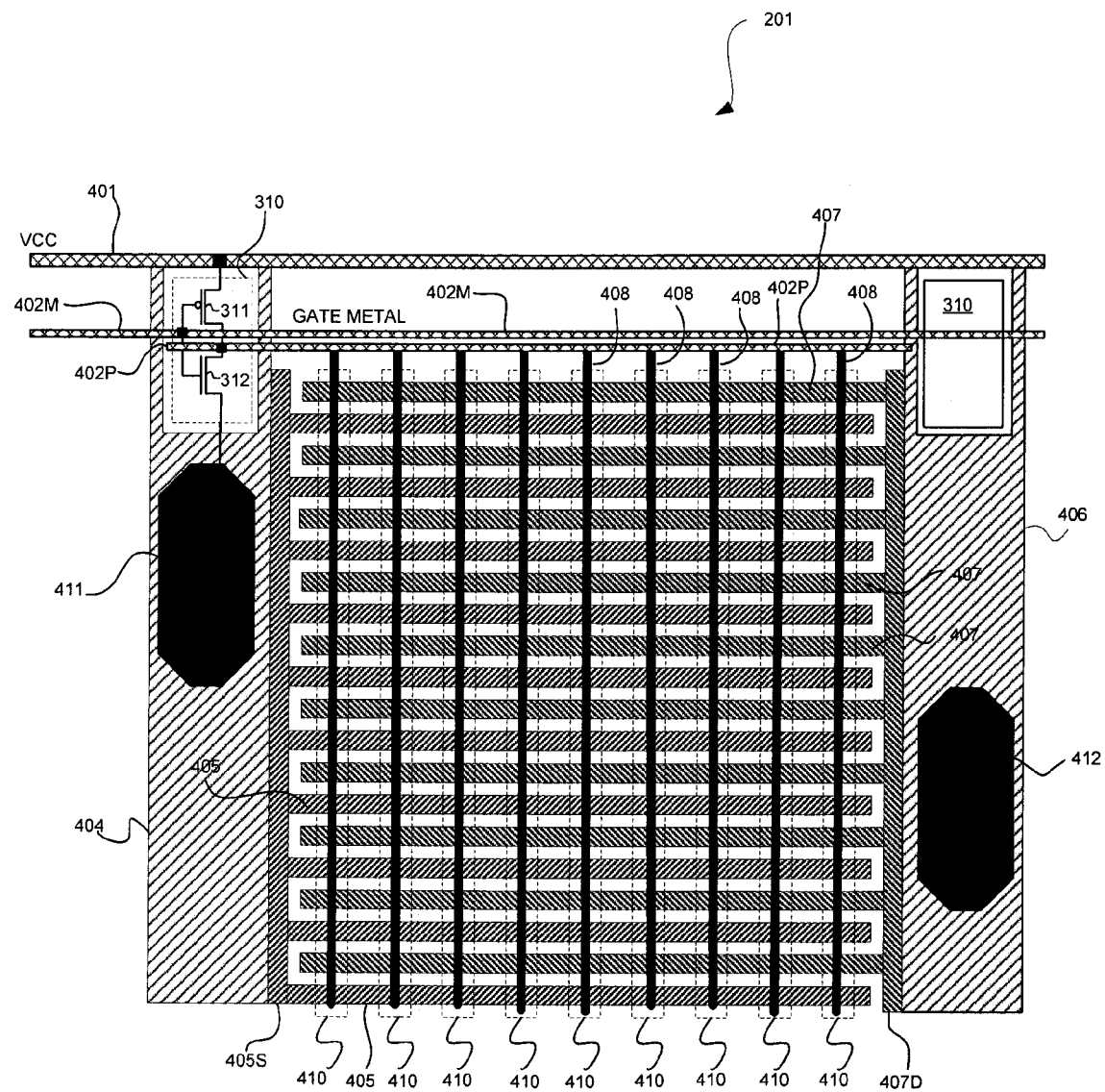
FIG. 4 illustrates a layout scheme for an exemplary Diffused Metal Oxide Semiconductor (DMOS) switching element in the array that includes a large number of discrete DMOS transistors successively laid out in parallel to one another in accordance with an embodiment of the present invention.

Now referring to FIG. 4, a planar view of a layout scheme for a high-side DMOS switching element 201 in accordance with the present invention is illustrated. In one embodiment of the present invention, all high-side DMOS switching transistors 201 and all low side DMOS switching elements 202 are fabricated by the same process. Thus, the layout scheme shown in FIG. 4 for an exemplary DMOS switching element 201 is representative of both-high side DMOS switching transistors 201 and low-side DMOS switching transistors 202.

Continuing with FIG. 4, each DMOS switching transistor 201 includes a large number of discrete DMOS transistors (cell) 410 laid out successively and next to one another. More particularly, in FIG. 4, discrete DMOS transistor 410 runs north south and parallel to one another. Each discrete DMOS transistor 410 includes a source electrode 405, a gate electrode 408, and a drain electrode 407. Gate electrodes 408 is of poly silicon material (gate poly) represented by bold solid lines parallel to one another that also run north and south. In one embodiment, gate electrode 408 further comprises many elongated gate islands (not shown) so that the size of each discrete DMOS transistors 410 is smaller. Source electrodes 405 are disposed parallel to one another, represented by forward cross pattern running west-east (left to right) and having a finger shaped structure. Similarly, drain electrodes 407 are disposed parallel to one another, represented by backward cross pattern running east-west (right to left) and having a finger shaped structure. Accordingly, source electrodes 405 and drain electrodes 407 form a metallization inter-digital pattern that is laid over gate electrodes 408. Source electrodes 405 are originated from a source metal line 405S that is electrically coupled to a first power bus 404. A switch contact pad (SW) 411 is placed on first power bus 404 for picking up all source electrodes 405 within high side switching element 201. As such, switch contact pad (SW) 411 behaves as an electrical node that communicates with source electrodes 405. Drain electrodes 407 are originated from a drain metal line 407D that is electrically coupled to a second power bus 406. An input contact pad (IN) 412 is placed on second power bus 406 for picking up all drain electrodes 407 within one high side switching element 201. As such, switch contact pad (SW) 412 functions as an electrical node that communicates with drain electrodes 407.

Continuing with FIG. 4, a gate driver circuit 310 is integrated to each high side DMOS switching element 201 on the same semiconductor die. In one embodiment, gate driver circuit 310 is an inverter that includes a pull-up PMOS transistor 311 connected to a pull-down NMOS transistor 312. A power supply metal bus 401 spans across semiconductor die to distribute a supply voltage ($V_{CC}$) to every single gate driver circuit 310. An input signal metal bus 402M also runs across the semiconductor die, connected to the input (gate connection) of gate driver circuit 310 to provide driving signal to each gate driver circuit 310 within high side DMOS switching element 201. A gate driver metal bus 402P connected to the output of gate driver circuit 310 and drives the gate electrodes 402P to drive all discrete DMOS transistors 410. In one embodiment of the present invention, inter-digital metallization pattern and gate poly lines 414 are laid in perpendicular to each other.

Figure 5:
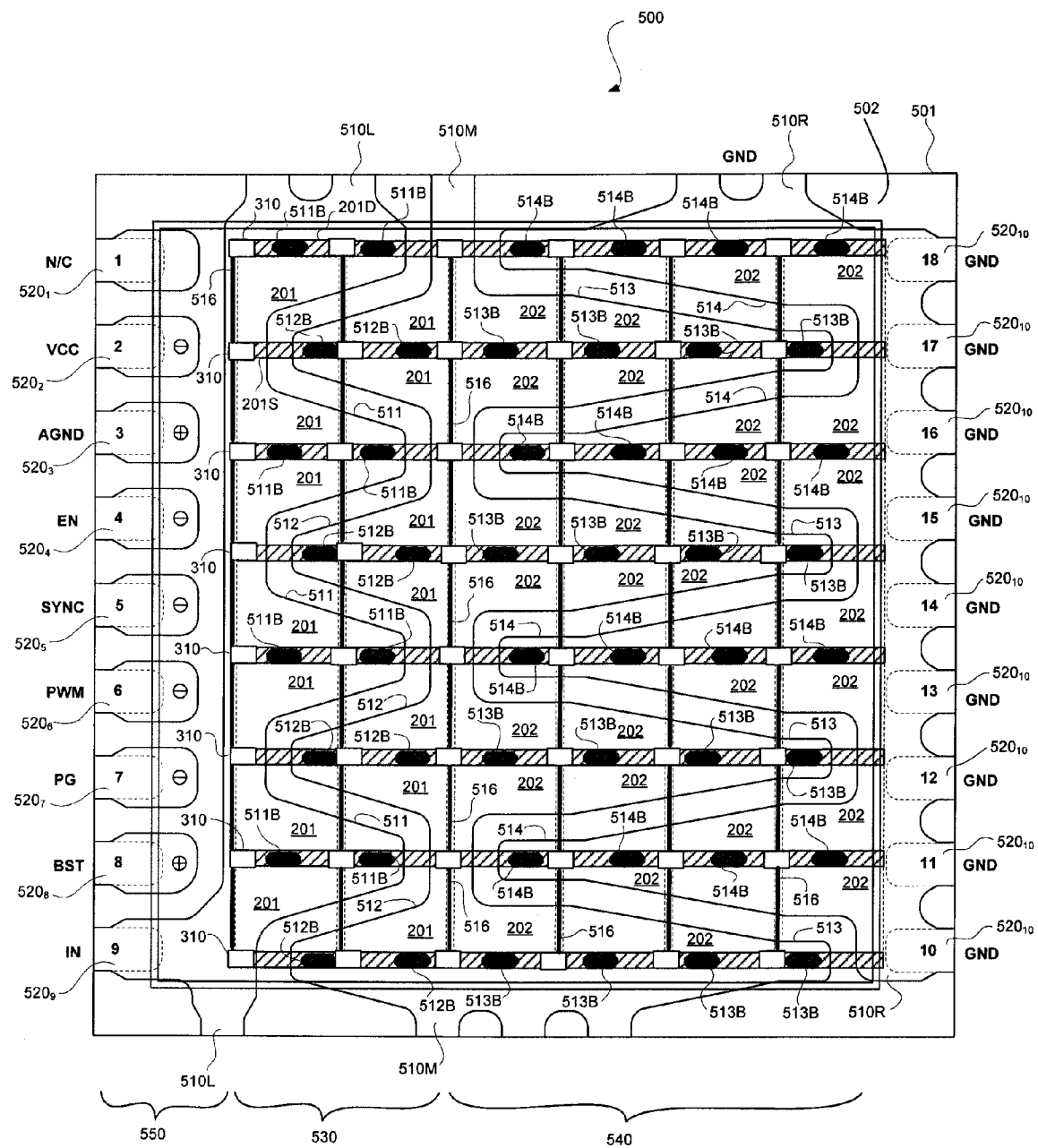
FIG. 5 illustrates a FIG. 5 illustrates the top plan view of a high power switch-mode voltage regulator output stage that includes the semiconductor flip chip die produced by the method of FIG. 2 that is supported by a lead frame structure in accordance with an embodiment with the present invention.

Now referring to FIG. 5, a top plan view of a high power switch-mode voltage regulator output stage 500 that includes the semiconductor flip chip die 502 fabricated using method 200 of FIG. 2 and a lead frame structure 501 in accordance with an embodiment with the present invention is illustrated. As shown in FIG. 5, high power switch-mode voltage regulator output stage 500 includes lead frame structure 501 adapted to support semiconductor flip chip die 502 as described in FIG. 3, all being encapsulated by a molding material 503. Lead frame structure 501 is the metal 'skeleton' made by any suitable method such as etching. Lead frame structure 501 provides both mechanical support and a means for electrical communication between semiconductor flip chip die 502 and external circuitry (not shown). In one embodiment of the present invention, semiconductor flip chip die 502 includes a high side section 530, a low side section 540, and a peripheral section 550. Within semiconductor flip chip die 502, high side section 530 is partitioned into an array of switching elements 201, low side section 540 is partitioned into array of switching elements 202, and peripheral section 550 is reserved for peripheral circuitry such as supply voltage regulator circuit 331, band gap circuit 332, floating boot strap charging circuit 333, first level shifter circuit 334, and second level shifter circuit 335 as described in FIG. 3. High side array of switching elements 201 and low side array of switching elements 202 are described in detailed in FIG. 3 and FIG. 4.

Continuing with FIG. 5, lead frame structure 501 includes electrical leads $520_1$-$520_{10}$ that are electrically coupled to a first plurality of finger shaped structures 511, a second plurality of finger shaped structures 512, a third plurality of finger shaped structures 513, and a fourth plurality of finger shaped structures 514. In particular, first plurality of finger shaped structures 511 and second plurality of finger shaped structures 512 form an inter-digital pattern that substantially receives high side array of switching elements 201 via flip chip bumps 511B and 512B respectively. First plurality of finger shaped structures 511 functions as an electrical node that picks up all the drains of high side array of switching elements 201 via flip chip bumps 511B. On the other hand, second plurality of finger shaped structures 512 functions as an electrical node that picks up all the sources of high side array of switching elements 201 via flip chip bumps 512B. Similarly, second plurality of finger shaped structures 513 and fourth plurality of finger shaped structures 514 form an inter-digital pattern that substantially receives low side array of switching elements 202 via flip chip bumps 513B and 514B respectively. Second plurality of finger shaped structures 513 functions as an electrical node that picks up all the drains of low side array of switching elements 202 via flip chip bumps 513B. On the other hand, fourth plurality of finger shaped structures 514 functions as an electrical node that picks up all the sources of low side array of switching elements 202 via flip chip bumps 514B.

Lead frame structure 501 having at least two electrical leads coupled to a plurality of finger shaped structures 511-514 that form inter-digital patterns where semiconductor flip chip 502 is bonded described above is similar to lead frame structure described in a patent application entitled "Method and Flip Chip Structure for High Power Devices" by Hunt Hang Jiang filed on Aug. 24, 2006 and incorporated in its entirety herewith for reference.

Figure 6:
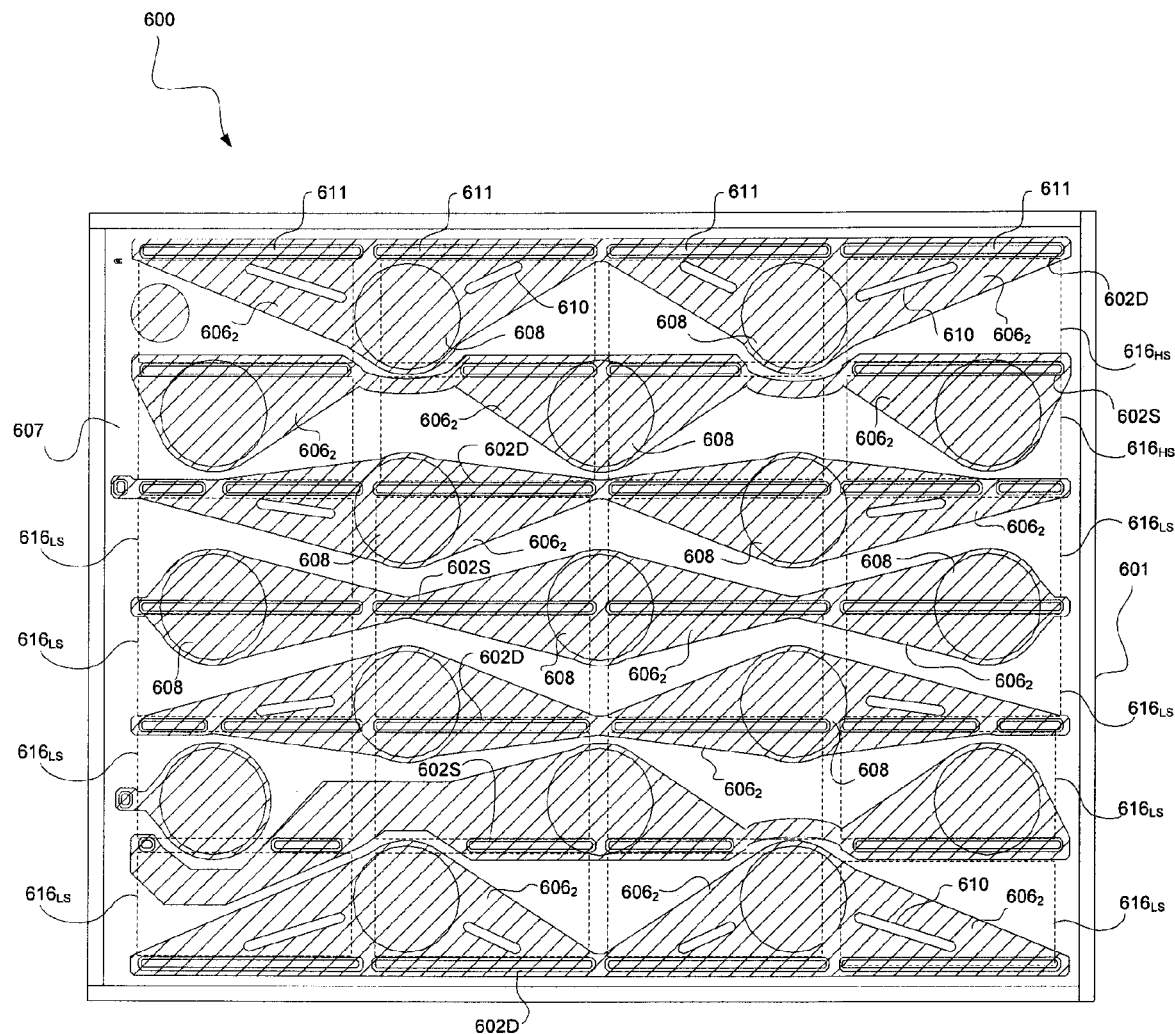
FIG. 6 illustrates the top plan view of a high power switch-mode voltage regulator output stage that includes the semiconductor flip chip die produced by the method of FIG. 2 embodied in a chip scale package (CSP) configuration in accordance with an embodiment of the present invention.

Now referring to FIG. 6, a top plan view of chip scale package 600 that contains a high power switch-mode voltage regulator chip 300 fabricated by method 200 of FIG. 2 and as described in details in FIG. 3 and FIG. 4 is illustrated. That is, high power switch-mode voltage regulator chip 300 is partitioned into a high side array of switching elements $616_{HS}$ and low side array of switching elements $616_{LS}$. Each high side array of switching elements $616_{HS}$ includes drain metal power buses 602D and source metal power buses 602S. Openings are etched along each drain metal bus 602D and each source metal bus 602S that form contact pads 611. Next, multi-layer Under Bump Metallization (UBM) power buses 606, each including a large thick copper layer $606_2$ shown in cross-hatched areas is placed over contact pads 611.

In one embodiment, a number of stress relief slots or cuts 610 are formed on the surface of thick copper layer $606_2$ for both thermal and mechanical stress relief. As shown, interconnection balls 608 are deposited on thick copper layer $606_2$ either directly over contact pads 611 or on the extended portion of multi-layer UBM power bus $606_2$. Accordingly, multi-layer UBM power buses 606 and interconnection balls 608 function as input/output electrical nodes that provides electrical communications and operations between high side switching elements $616_{HS}$ and low side switching elements $616_{LS}$ with external circuitry.

Chip Scale Package 600 having an array of parallel multi-layer UBM power buses 606 disposed over contact pads 611 to pick up the sources and the drains of switching elements $616_{HS}$ and $616_{LS}$ respectively is similar to Chip Scale Package 300A and 300B described in a patent application entitled "Method and Chip Scale Package for High Power Devices" by Hunt Hang Jiang filed on Aug. 24, 2006 and incorporated in its entirety herewith for reference.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

Although the integrated circuits discussed above are switch-mode voltage regulator output stage, the present invention is also applicable to class D audio amplifiers, motor controls, and Cold Cathode Fluorescent Lamp (CCFL).

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A high power switch-mode voltage regulator output stage, comprising:
    a semiconductor die comprising an array of switching elements individually including a source contact pad and a drain contact pad, and a plurality of gate driver circuits individually adjacent to and dedicated to drive one of said switching elements so that target amount of current is injected from said gate driver circuit to drive said corresponding switching element; and
    a lead frame attached to said semiconductor die, said lead frame comprising first and second electrical leads corresponding to a source and a drain connection, said first and second electrical leads having first and second plurality of finger shaped structures, respectively, wherein said first and second electrical leads are arranged so that said first and second plurality of finger shaped structures form an inter-digital pattern, and wherein said first plurality of finger shaped structures are in electrical contact with said source contact pads of said array of switching elements, and wherein said second plurality of finger shaped structures are in electrical contact with said drain contact pads of said array of switching elements.

2. The high power switch-mode voltage regulator output stage of claim 1 wherein said each switching element further comprises a plurality of discrete Double Diffused Metal Oxide Semiconductor (DMOS) transistors laid out in parallel to one another.

3. The high power switch-mode voltage regulator output stage of claim 1 wherein said array of switching elements further comprises:
    a metal power supply bus electrically coupled to provide supply voltages to said plurality of gate driver circuits;
    a metal input driver bus electrically connected to said plurality of gate driver circuits; and
    a metal gate driver bus electrically coupled to the gates of said plurality of discrete DMOS transistors.

4. The high power switch-mode voltage regulator output stage of claim 1 wherein said array of switching elements further comprises an inter-digital metallization pattern.

5. The high power switch-mode voltage regulator output stage of claim 4 wherein said inter-digital metallization pattern further comprises:
    a drain metal line electrically connected to drain electrodes of said plurality of discrete DMOS transistors; and
    a source metal line electrically connected to source electrodes of said plurality of discrete DMOS transistors, said source electrodes substantially parallel to said drain finger electrodes that forms said inter-digital metallization pattern.

6. The high power switch-mode voltage regulator output stage of claim 5 further comprising:
    an input contact pad electrically coupled to said drain metal line; and a switch contact pad electrically coupled to said source metal line.

7. The high power switch-mode voltage regulator output stage of claim 6 wherein said semiconductor die includes a flip chip die fabricated and placed on said lead frame structure so that said plurality of finger shaped structures are substantially parallel to said input contact pad and said switch contact pad, and wherein:
said plurality of finger shaped structures are electrically coupled to pick up the currents generated by each of said switching elements at said switch contact bus by a first plurality of flip chip bumps; and
said plurality of finger shaped structures are electrically coupled to deliver said input voltage to said switching elements at said input contact bus by a second plurality of flip chip bumps.

8. The high power switch-mode voltage regulator output stage of claim 1 wherein said semiconductor die and said lead frame structure are encapsulated by a molding material into a quad flat package with no leads (QFN).

9. The high power switch-mode voltage regulator output stage of claim 1 wherein said semiconductor dies and said lead frame structure are encapsulated by a molding material into a small outline package (SOP).

10. A high power switch-mode voltage regulator output stage, comprising:
a semiconductor die having an array of switching elements individually including:
a plurality of discrete transistors in parallel to one another individually having a source and a drain;
a first contact pad electrically coupled to the source of said plurality of discrete transistors;
a second contact pad electrically coupled to the drain of said plurality of discrete transistors;
a gate driver circuit configured to drive said plurality of discrete transistors so that a target amount of current is injected from said gate driver circuit to said plurality of discrete transistors through the source and the drain;
a lead frame attached to said semiconductor die, said lead frame including first and second electrical leads spaced apart from each other, wherein:
said first and second electrical leads include first and second plurality of finger shaped structures, respectively;
said first and second plurality of finger shaped structures form an inter-digital pattern;
said first plurality of finger shaped structures are in electrical contact with said first contact pads of said array of switching elements; and
said second plurality of finger shaped structures are in electrical contact with said second contact pads of said array of switching elements.

11. The high power switch-mode voltage regulator output stage of claim 10 wherein said plurality of discrete transistors include a plurality of discrete Double Diffused Metal Oxide Semiconductor (DMOS) transistors in parallel to one another.

12. The high power switch-mode voltage regulator output stage of claim 10 wherein said array of switching elements further comprises:
a metal input driver bus electrically connected to said plurality of gate driver circuits; and
a metal gate driver bus electrically coupled to the gates of said plurality of discrete transistors.

13. The high power switch-mode voltage regulator output stage of claim 10 wherein said array of switching elements further comprises an inter-digital metallization pattern.

14. The high power switch-mode voltage regulator output stage of claim 13 wherein said inter-digital metallization pattern further comprises:
a drain metal line electrically connected to said drain of said plurality of discrete transistors; and
a source metal line electrically connected to said source of said plurality of discrete transistors.

15. The high power switch-mode voltage regulator output stage of claim 14 further comprising:
an input contact pad electrically coupled to said drain metal line; and
a switch contact pad electrically coupled to said source metal line.

16. The high power switch-mode voltage regulator output stage of claim 15 wherein said semiconductor die is on said lead frame structure so that said plurality of finger shaped structures are substantially parallel to said input contact pad and said switch contact pad, and wherein said plurality of finger shaped structures are electrically coupled to pick up the currents generated by each switching element at said switch contact bus by a plurality of flip chip bumps.

17. The high power switch-mode voltage regulator output stage of claim 10 wherein said semiconductor die and said lead frame structure are encapsulated by a molding material into a quad flat package with no leads (QFN).

18. The high power switch-mode voltage regulator output stage of claim 10 wherein said semiconductor flip chip dies and said lead frame structure are encapsulated by a molding material into a small outline package (SOP).

* * * * *